(12) United States Patent
Rahim et al.

(10) Patent No.: US 7,650,581 B2
(45) Date of Patent: Jan. 19, 2010

(54) METHOD FOR MODELING AND VERIFYING TIMING EXCEPTIONS

(75) Inventors: Solaiman Rahim, San Diego, CA (US); Mayank Jain, Noida, IN (US)

(73) Assignee: Atrenta, Inc., San Jose, CA (US)

( * ) Notice: Subject to any disclaimer, the term of this patent is extended or adjusted under 35 U.S.C. 154(b) by 279 days.

(21) Appl. No.: 11/749,090

(22) Filed: May 15, 2007

(65) Prior Publication Data

US 2008/0288904 A1 Nov. 20, 2008

(51) Int. Cl.
*G06F 17/50* (2006.01)
(52) U.S. Cl. .............................. 716/6; 716/4
(58) Field of Classification Search ............ 716/4, 716/6; 714/726
See application file for complete search history.

(56) References Cited

U.S. PATENT DOCUMENTS

| | | | |
|---|---|---|---|
| 5,638,290 A * | 6/1997 | Ginetti et al. ............... 716/2 |
| 5,966,521 A | 10/1999 | Takeuchi et al. |
| 6,714,902 B1 | 3/2004 | Chao et al. |
| 6,952,812 B2 | 10/2005 | Abadir et al. |
| 7,299,437 B2 * | 11/2007 | Higuchi ....................... 716/6 |
| 2007/0011527 A1 * | 1/2007 | Goswami et al. ........... 714/726 |
| 2008/0098271 A1 * | 4/2008 | Muller-Brahms ........... 714/738 |
| 2009/0044159 A1 * | 2/2009 | Vinitzky et al. ............. 716/6 |

* cited by examiner

*Primary Examiner*—Thuan Do
*Assistant Examiner*—Magid Y Dimyan
(74) *Attorney, Agent, or Firm*—Sughrue Mion, PLLC

(57) ABSTRACT

A method and system for timing exception verification in integrated circuit (IC) designs included verification of functional false paths as well as multi-cycle paths (MCPs). A false path or a MCP is modeled to a satisfiability formula and the formula is validated using a Boolean satisfiability solver. Time required for timing exception verification can be significantly reduced.

19 Claims, 5 Drawing Sheets

METHOD FOR MODELING AND VERIFYING TIMING EXCEPTIONS

TECHNICAL FIELD

The present invention relates to the verification of timing exceptions in the design of integrated circuits.

BACKGROUND OF THE INVENTION

In recent years, the size of integrated circuits (ICs) has dramatically increased in both area and number of gates, requiring designers to spend time and effort to meet timing closure for the IC design. Moreover, complexity, speed and deep-submicron effects make timing closure of IC designs a more critical task. In order to enable a designer to achieve accurate timing closure, static timing analyzers and other timing optimization tools are utilized.

In IC design, every path that originates from either an input port or a register clock pin, must be properly constrained to obtain correct implementation of the RTL description. Typically, timing constraints are applied mainly to achieve the following: 1) describing the different attributes of clock signals, such as clock frequency, duty cycle, clock skew, and clock latency; 2) specifying input and output delay requirements of ports relative to a clock transition; and, 3) setting up timing exceptions. Different types of timing exceptions are possible, for example, set minimum delay, set maximum delay, set disable arc, set false path, set multi-cycle path, and so on, that are known to those skilled-in-the-art.

False paths and multi-cycle paths are timing exceptions which, if not specified or not handled correctly, will most certainly result in not achieving timing closure. False paths are logic paths which cannot be sensitized because they are functionally blocked, because of delays in re-convergent logic, or because of disabled arcs. As an example, FIG. 1 shows a logic circuit 100 that includes a false path 110 that is a result of re-convergent logic. That is, in order to allow a signal to propagate on path 110, an input 130 should have the value '1' and '0' at the same time. This can be achieved only if there is correct synchronization of the delays of input 130.

Generally there are four types of false paths: 1) clock domain crossing (CDC) false paths; 2) asynchronous false paths that include false paths to scan enable paths and false paths to asynchronous set/reset paths; 3) functional false path that include combinational as well as sequential false paths; and, 4) timing false paths.

Multi-cycle paths are paths that intentionally require more than one clock cycle to propagate data. This information cannot possibly be inferred by the timing analyzer, and therefore multi-cycles paths must be specified by the designer. FIG. 2 shows a circuit 200 that includes flip-flops 210-1 through 210-4, two multiplexers (MUX) 220-1 and 220-2, and a combinational logic 230. An input 250 and an output 255 are a primary input and a primary output respectively. Flip-flops 210-3 and 210-4 constitute a four cycle gray code counter. The state transitions of the gray-code counter is determined by the following sequence:

$$(0, 0) \rightarrow (0, 1) \rightarrow (1, 1) \rightarrow (1, 0) \rightarrow (0, 0),$$

MUX 220-1 selects input 250 when the transition of the gray-code counter is (0, 0), i.e., (FF 210-3, FF 210-4)=(0, 0). Then, flip-flop 210-1 is set to the value at input 250 when (FF 210-3, FF 210-4)=(0, 1). On the other hand, MUX 220-2 selects the output of combinational logic 230 when (FF 210-3, FF 210-4)=(1, 0). Flip-flop 210-2 is then set to the input's value when (FF 210-3, FF 210-4)=(0, 0). Three clocks are required to go from state (0, 1) to state (0, 0). Thus, the path from flip-flop 210-1 to flip-flop 210-2 is multi-cycle path that uses three clocks cycle to propagate signals. Consequently, the timing constraint of the paths can be relaxed from a single clock cycle to three clock cycles.

In typical IC designs, time exceptions are generated and then verified. Prior art timing verification techniques can be grouped into three categories: timing simulation, static timing analysis (STA), and functional timing analysis (FTA). The major drawback of these techniques is in their inability to verify sequential false paths, i.e., verification under normal operating conditions. A technique that verifies both combinatorial and sequential false paths is disclosed in U.S. Pat. No. 6,714,902 by Chao et. al (hereinafter the "902 patent") incorporated herein by reference for the useful understanding of the background of the invention. The '902 patent discloses a method and apparatus for critical and false path verification by taking all the potential false paths and capturing the conditions that make them true paths as a Boolean expression, for the combinational logic only. If the Boolean condition can be satisfied, the simulation is performed on the sequential logic to justify those values. If the satisfiability engine fails to finish, then the simulation is run on the combinational logic, and an attempt is made to justify the values sequentially as well. Specifically, the method of the '902 patent computes a sensitization condition and checks if the condition is true using a Boolean engine. A sensitization condition is computed by taking all the gates of a path and determining what is the propagation condition of the path. In addition a sensitization condition is determined for all sub-paths between through points of a false path. As an example, for the following false path:

set_false_path-from A -th B -th C -to D the method of the '902 finds all sections between through points A and B, B and C, and all sections from points C to D. For each such section a sensitization condition is computed. As a result, the time required to verify a single path is very long. In modern ICs, where the number of false paths may be large, such an approach is inefficient, time-consuming and error prone.

It would be therefore advantageous to provide an efficient solution for verifying false paths in IC designs. It would be further advantageous if the proposed solution would also verify multi-cycle paths.

DETAILED DESCRIPTION OF AN EMBODIMENT OF THE INVENTION

Now herein is disclosed a method and system for timing exception verification in integrated circuit (IC) designs. An exemplary embodiment is directed to a computer aided design (CAD) method and system. Specifically, the method verifies functional false paths as well as multi-cycle paths (MCPs). The method models a false path or a MCP to a satisfiability formula and validates the formula using any Boolean satisfiability solver. Embodiments of a system as described herein may significantly reduce the time required for timing exception verification.

To verify a false path the method transforms the path into a satisfiability formula using by Xor-ing (i.e., performing a XOR operation) of two functions to be verified and checking if the output of the XOR operation equals to zero logic value for any input combination.

Figure 1:
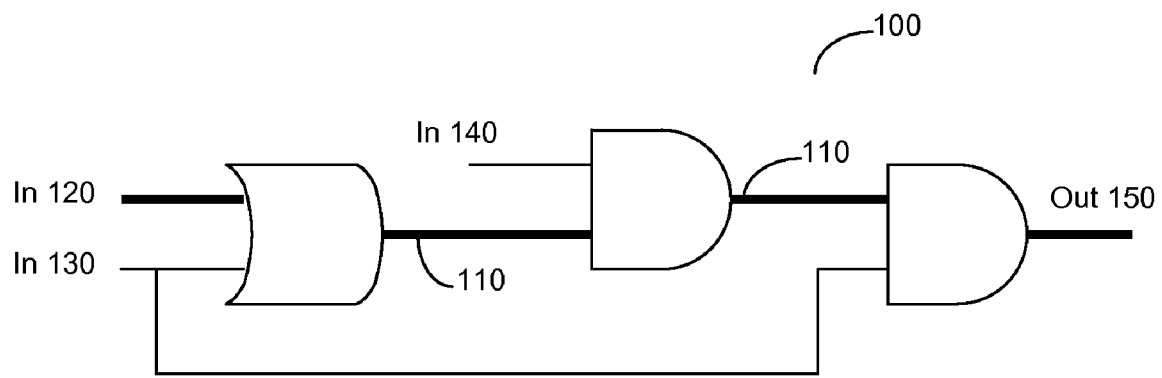
FIG. 1 is a schematic diagram of a logic circuit that includes a false path (prior art)
Figure 2:
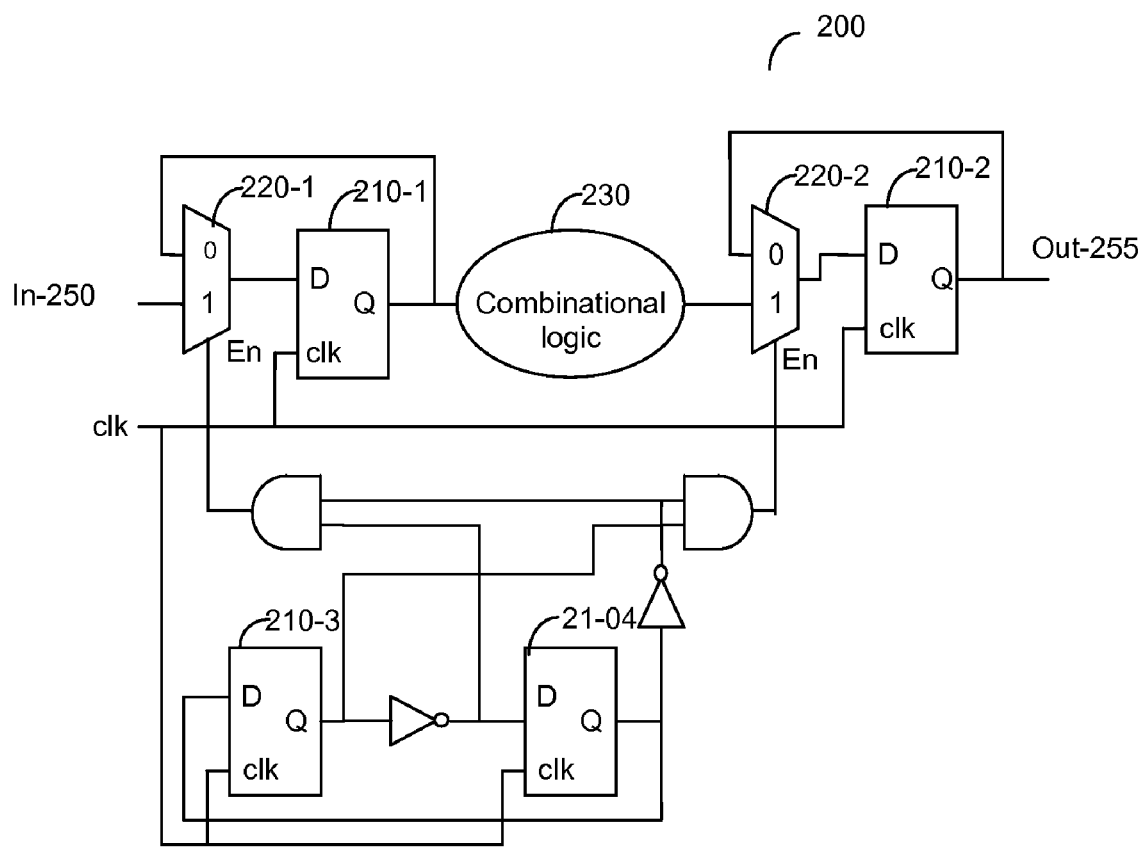
FIG. 2 is a schematic diagram of a logic circuit that includes a multi-cycle path (prior art)
Figure 3A:
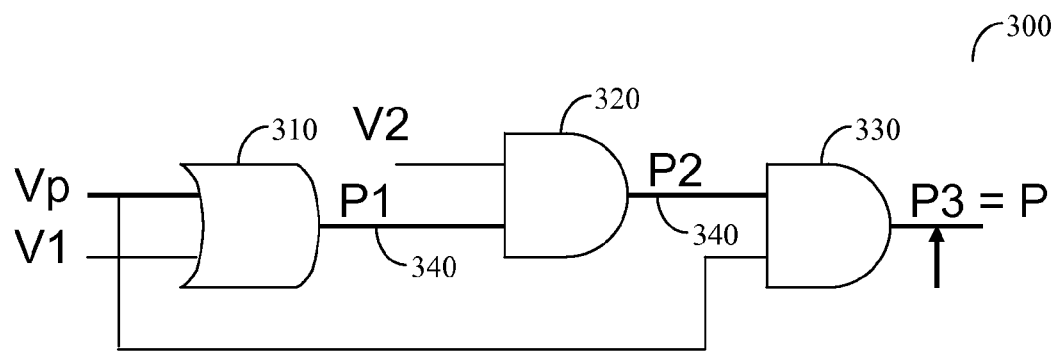
FIG. 3 is a logic circuit used to describe the modeling process

FIG. 3A shows a diagram of an exemplary and non-limiting logic circuit 300 used to describe the modeling of a false path to a satisfiability formula. Circuit logic 300 includes an OR gate 310 and two AND gates 320 and 330. A path 340 is established between an input 372 and gates 310, 320 and 330. A designer sets path 340 as a false path. i.e., set_false_path-from $V_P$-through $P_1$-through $P_2$-to $P_3$ Vp is the literal representing a starting point (-from) point, $P_1$ and $P_2$ are the -through points and P3 is an output (-to) point, $P_1$, $P_2$ and $P_3$ are sections of a path P(340).

The modeling of a false path to a satisfiability formula includes duplicating the logic circuit that includes path 340; connecting each pair of sections to a XOR gate, i.e., connecting the respective -through or -to points in both circuits; connecting the outputs of the XOR gates to an AND gate, de-coupling the -through from the logic circuits, and setting the starting (-from) points and the -through points to zero and one logic values.

Figure 3B:
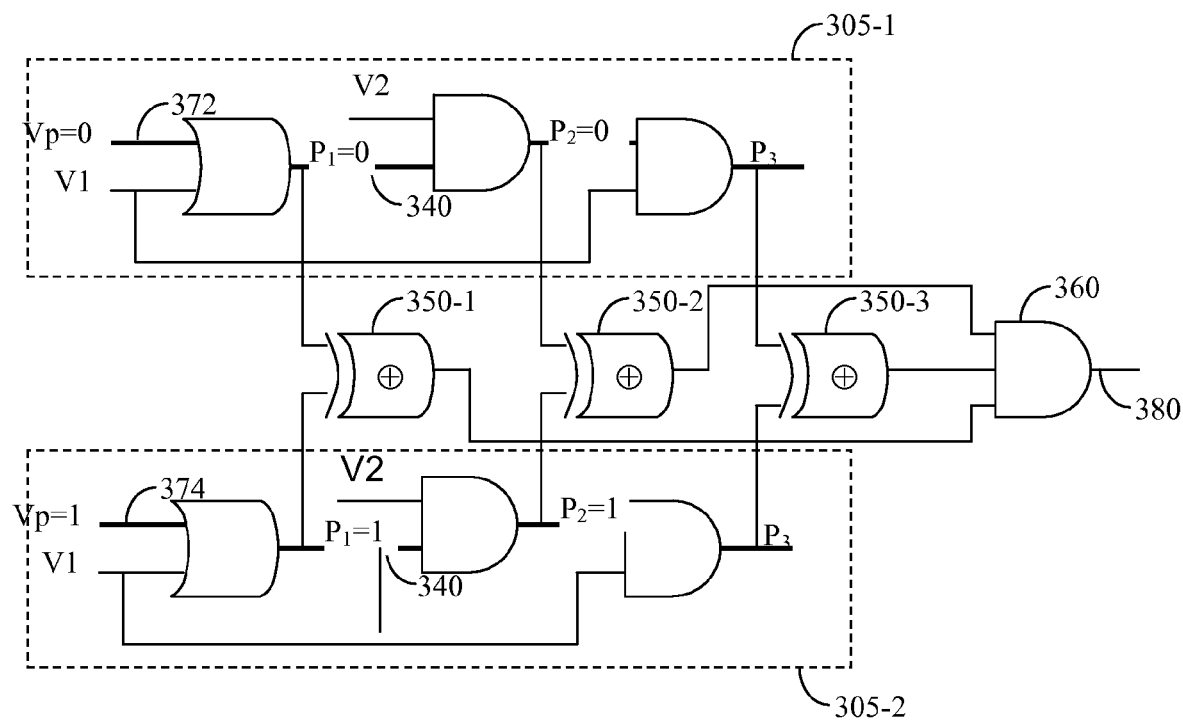

The output of the modeling of path 340 is schematically shown in FIG. 3B. Logic circuit 300 is duplicated to circuits 305-1 and 305-2, each of which includes path 340. XOR gates 350-1, 350-2 and 350-3 respectively coupled to points $P_1$, $P_2$ and $P_3$ of circuits 305-1 and 305-2. The inputs of AND gate 360 are the output XOR gates 350-1, 350-2 and 350-3. In addition, the points $P_1$, $P_2$ and $P_3$ are de-coupled from their preceding connections and set to the values at inputs 372 and 374. The inputs 372 and 374 are the starting point (Vp) of path 340 and set to '0' and '1' logic values respectively. The path 340 is a false path if for any combination values at inputs V1 and V2 the output 380 is a zero logic value. That is, $(V_1 \text{ XOR}_1) \text{ AND } ((V_1 \text{ AND } V_2) \text{ XOR } V_2) \text{ AND } ((V_2 \text{ AND } V_1) \text{ XOR } (V_1 \text{ AND } V_2)) = 0$ Mathematically, the modeling of a candidate false path to satisfiability formula can be described as follows:

$$\prod_{i=0}^{i=n} (Fi(V_p = 0) \otimes F_i(V_p = 1)) = 0;$$

where $F_i$ represents the Boolean function of a section $P_i$.

Figure 4:
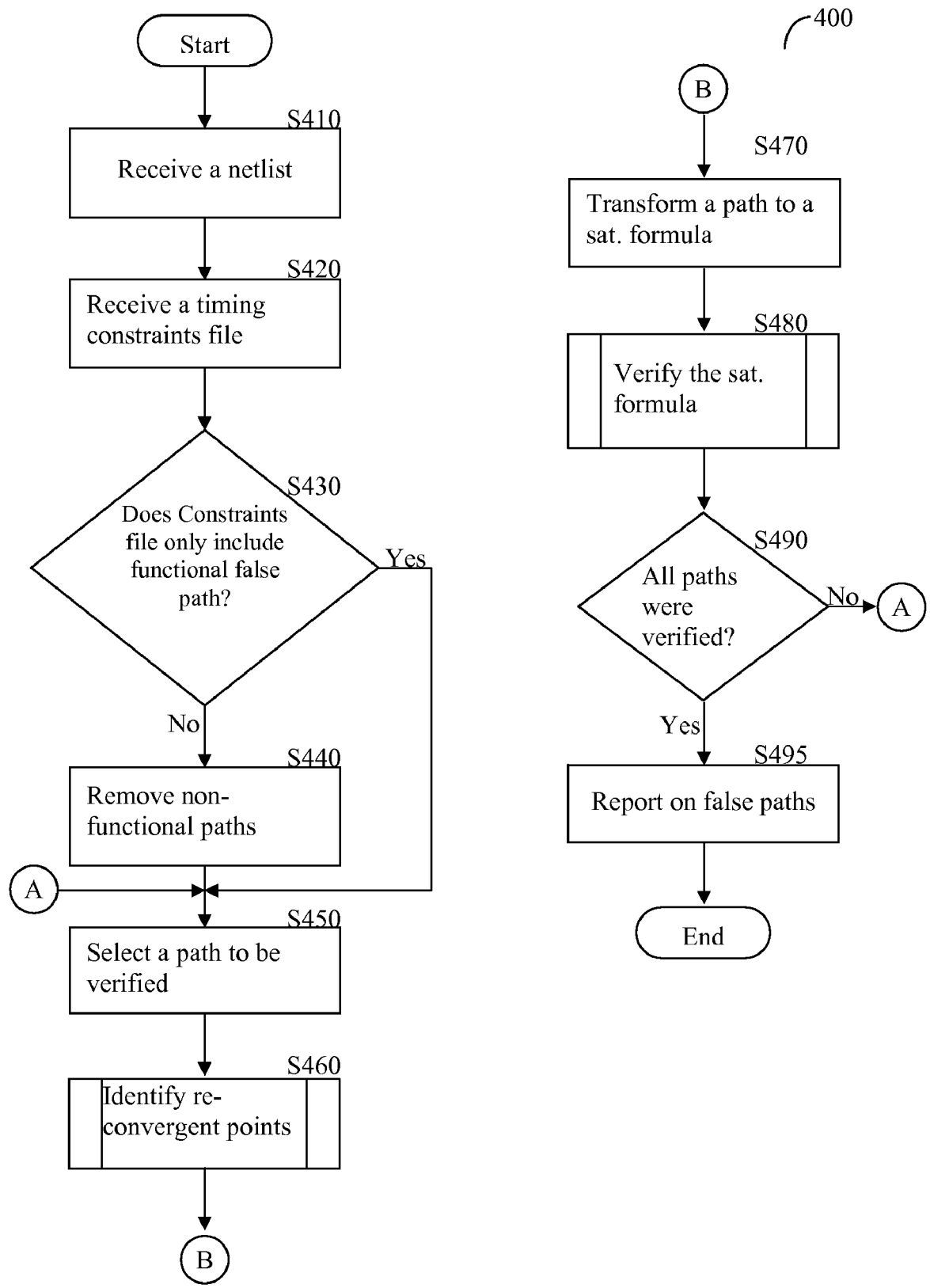
FIG. 4 is a flowchart describing the method for verifying false paths in accordance with one embodiment of the present invention

FIG. 4 shows a non-limiting and exemplary flowchart 400 describing the method for modeling and verifying false paths in accordance with one embodiment of the present invention. At S410, a netlist of an IC design is received. The synthesized netlist is produced by an IC synthesis tool that produces a gate level netlist based on a RTL representation, a timing constraint file, and a technology library. A netlist generally includes logic gates such as AND, NAND, NOR, OR, XOR, NXOR, NOT, functional blocks, multipliers, adders, memories, and so on. In addition a netlist includes the interconnection between the logical gates and different blocks. At S420, a timing constraints file, that includes at least a list of candidate false paths in the design, is received. The file may also include clock definitions as well as input and output delays. A path is represented using, for example, the following notation:

-from {frm1, frm2 . . . frmN}-through {thru1} . . .
-through {thruM} . . . -to {to1, . . . toR}

The -from points is the starting point, the -through points are the sections, and -to points are the end-points. The constraints file may be, for example, in a Synopsys® design constraints format (SDC) and is used to constrain the design for a logic synthesis tool. The list of false paths can be manually designated by a circuit designer or automatically by a timing exception generation tool. One such timing exception tool is disclosed in a U.S. patent application Ser. No. 11/676, 232 entitled "A method for generating timing exceptions", assigned to the common assignee and is hereby incorporated by reference for all that it contains.

At S430, a check is performed to determine if the false paths in the constraints file include CDC, asynchronous, or timing false paths. If so, at S440, any such false path is removed from the constraints file to maintain only functional false path; otherwise, execution continues with S450. At S450, a single false path to be verified is selected from the constraints file. At S460, for the selected path a process for identifying from re-convergent logic is executed. Specifically, a path can be a false path due to re-convergence from the starting point. That is, one or more through or end points are not a function of the starting point. For example, as shown in FIG. 3A, a re-convergence point 'X' is not a function of the starting point Vp. Generally, re-convergence points can be defined as the points included in a path which starts from a starting (-from) point and does not pass through the preceding -through points of the designated false path. A circuit can have multiple re-convergence points between two consecutive -through/-to points.

To verify that the path is not a false path due to re-convergence, the method checks for a re-convergence condition, which is re-convergence points that are a function of a -from point. As an example the re-convergence condition of circuit 300 is "(X) f (Vp)". This is performed, by adding the identified re-convergence points to the -through points designated in the constraints file and computing the satisfiability formula also for these points.

At S470 the false path is transformed to a satisfiability formula as described in greater detail above. In accordance with one embodiment of the present invention, step S470 results with an OR-Inverter graph (ORG) which represents the satisfiability formula.

At S480, the satisfiablity formula is verified. That is, it is determined whether the satisfiability formula equals to zero logic value for any input value. The check can be done using various Boolean satisfiability solver including, but not limited to, Boolean satisfiability problem (SAT), automatic test pattern generation (ATPG), binary decision diagram (BDD), and the likes. At S490, it is determined whether all false paths in the constraints file were verified, and if so execution continues with S495; otherwise, execution return to S430. At S495, all paths that were verified as false paths are reported to the circuit designer, for example but not limited to, by means of display, report file, printed report and the likes.

Figure 5:
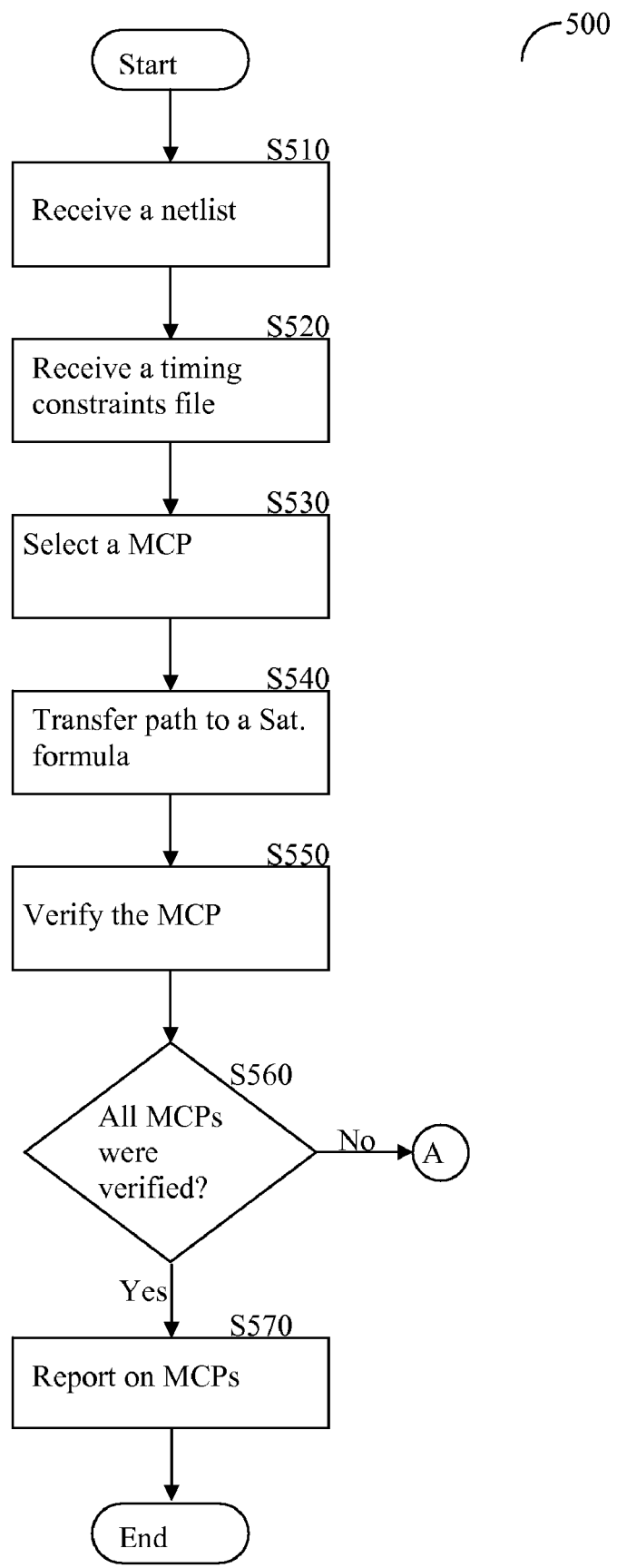
FIG. 5 is a flowchart describing the method for verifying multi-cycle paths in accordance with one embodiment of the present invention

FIG. 5 shows a non-limiting and exemplary flowchart 500 describing the method for modeling and verifying multi-cycle paths in accordance with another embodiment of the present invention. Multi-cycle paths are the paths having stable input for several clock cycles before the output is required and two or more cycles are allowed for signal propagation. Hence, the delay time of multi-cycle paths can be greater than the clock period. At S510, a netlist of an IC design is received. At S520, a timing constraints file including at least a list of candidate multi-cycle paths in the design is received. The file may also include clock definitions as well as input and output delays. A path is represented using, for example, the following notation:

set_multicycle_path -from {frm1, frm2 ... frmN}-
    through {thru1} ... -through {thruM} ... -to
    {to1,... toR}

The constraint file may be, for example, in a Synopsys® design constraints format (SDC) and is used to constrain the design for a logic synthesis tool. The list of multi-cycle paths can be manually designated by a circuit designer or automatically by a timing exception generation tool, such as the one mentioned above. At S530, a single multi-cycle path to be verified is selected from the constraints file. At S540 the path is transformed into a satisfiability formula as described in greater detail above. At S550, the satisfiablity formula is verified so as to determine whether the formula can be reached, or otherwise solved, in less clock cycles than it takes for the multi-cycle path (i.e., the number of clock cycles required to a signal to propagate through the multi-cycle path). If so, the multi-cycle path is not correct; otherwise, the path is correct. The check can be done, for example, by using any of the Boolean satisfiability solvers mentioned above. At S560, it is determined whether all multi-cycle paths are in the constraints file were verified, and if so execution continues with S570; otherwise, execution returns to S530. At S570, all paths that were verified as multi-cycle paths are reported to the circuit designer.

Figure 6:
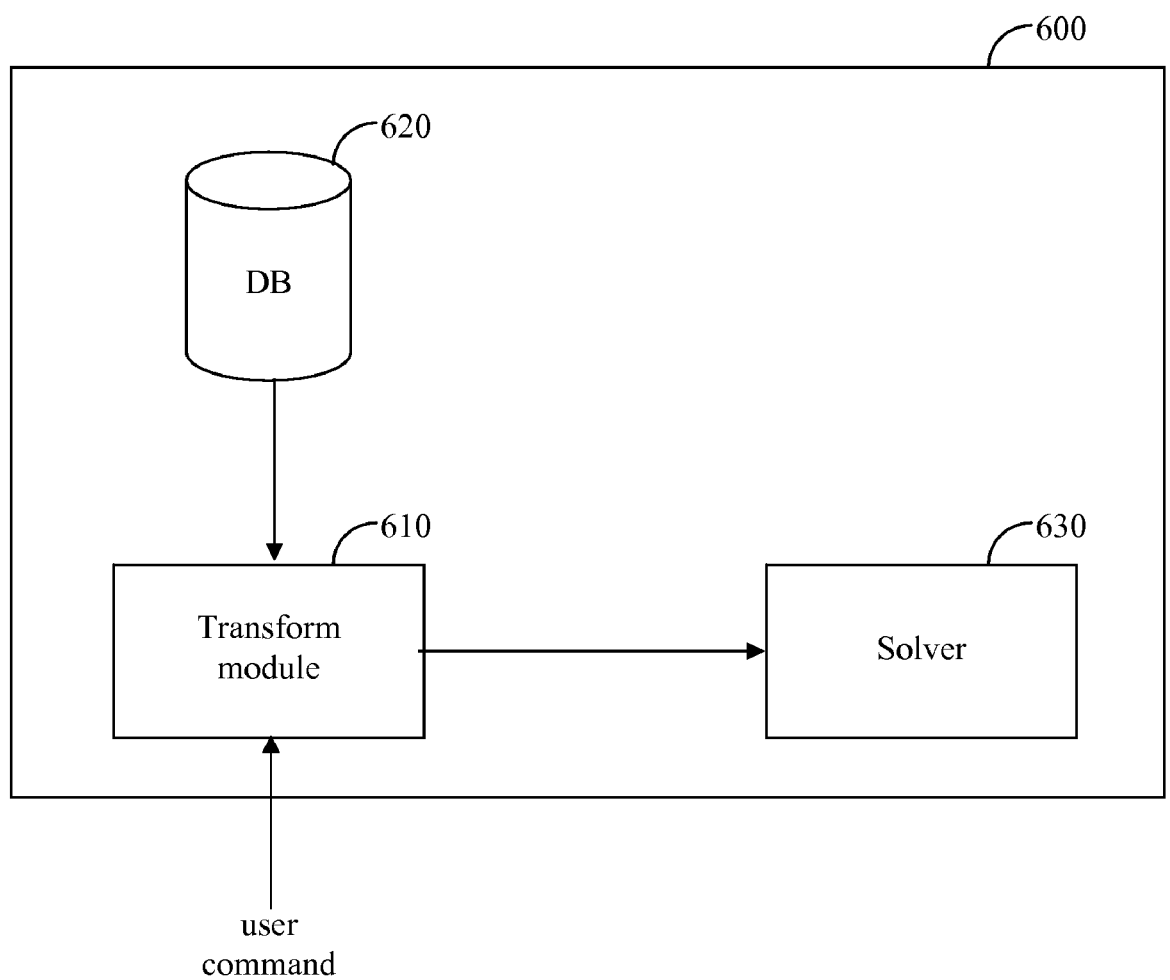
FIG. 6 is a flowchart describing the system for verifying timing exception in accordance with one embodiment of the present invention.

FIG. 6 shows an exemplary and non-limiting block diagram of a system 600 used for modeling and verifying timing exceptions in accordance with another embodiment of the present invention. System 600 includes a transform module 610 a database 620 and a solver 630. Database 620 includes a netlist of the design and a constraints file with the timing exceptions (false and multi-cycle paths). Transform module 610 transforms each path in the constraints file into a satisfiability formula that is verified by solver 630. Transform module 610 and solver 630 operate in three different modes: multi-cycle, combinational, and sequential. The combinatorial and sequential modes adapted to respectively validate combinational and sequential paths. The operative mode is determined by the circuit designer (user). The solver may be any type of Boolean satisfiability solver, such as SAT, ATPG, BDD, and the likes. Paths that are a verified timing exception, by the solver 630, as either multi-cycle or false, are saved database 620.

The exemplary embodiments of the present invention can be written as computer programs and can be implemented in computers that execute the programs using a computer readable recording medium. Further, an exemplary embodiment can be implemented on a computer aided design (CAD) system and a computer aided design program.

There is claimed:

1. A computer-implemented method, for modeling and verifying false paths in integrated circuit (IC) design, comprising:
    receiving a constraints file that includes at least one definition of a false path;
    for each false path in the constraints file, identifying re-convergence points in an input netlist of the IC design;
    modeling the false path together with the re-convergence points to produce a satisfiability formula;
    verifying the satisfiability formula using a Boolean satisfiability solver;
    storing a verification result of the verifying step in the memory of the computer; and
    providing a verification output based on the verification result;
    wherein a re-convergence point is a point in the false path that starts from a starting point and does not pass through at least one preceding through point.

2. The method of claim 1, further comprising reporting on paths that are verified as false paths.

3. The method of claim 1, wherein the false path is a functional false path.

4. The method of claim 1, wherein the re-convergence points are points included in a path that starts from a starting point and does not pass through preceding through-points of the false path.

5. The method of claim 4, wherein the identified re-convergence points are added to the through points of the false path.

6. The method of claim 1, wherein verifying the satisfiability formula further comprises determining whether the output of the satisfiability formula equals to a zero logic value for any logic value set in inputs of the logic circuits.

7. The method of claim 1, wherein the Boolean satisfiability solver comprises at least one of: Boolean satisfiability problem (SAT), automatic test pattern generation (ATPG), and binary decision diagram (BDD).

8. A computer aided design (CAD) system embodying a CAD program, said CAD program comprising a computer readable medium with instructions adapted to implement the method of claim 1.

9. A computer program product embodied on a computer readable medium with instructions that when executed on a computer perform the method of claim 1.

10. A computer-implemented method, for modeling and in false paths in integrated circuit (IC) design, comprising:
    receiving a constraints file that includes at least one definition of a false path;
    for each false path in the constraints file, identifying re-convergence points in an input netlist of the IC design;
    modeling the false path together with the re-convergence points to produce a satisfiability formula;
    verifying the satisfiability formula using a Boolean satisfiability solver;
    storing a verification result of the verifying step in the memory of the computer; and
    providing a verification output based on the verification result,
    wherein modeling the false path to satisfiability formula comprises:
        duplicating a logic circuit that includes the false path;
        connecting each pair of through points in the false path to a XOR gate;

connecting each pair of end points in the false path to a XOR gate;

connecting the outputs of the XOR gates to an AND gate;

setting the inputs of the through points to zero and one logic values; and setting the pair of starting points in the false path to zero and one logic values.

11. The method of claim 10, wherein connecting each pair of through points further comprises de-coupling the through points from the logic circuits.

12. The method of claim 10, wherein the through points comprise re-convergence points.

13. A computer-implemented method, for modeling and verifying multi-cycle paths in integrated circuit (IC) design, comprising:

receiving a constraints file that includes at least one definition of a multi-cycle path;

for each multi-cycle path in the constraints file, modeling the multi-cycle to a satisfiability formula;

verifying the satisfiability formula using a Boolean satisfiability solver;

storing a verification result of the verifying step in the memory of the computer; and providing a verification output based on the verification result, wherein modeling the multi-cycle path to satisfiability formula comprises:

duplicating a logic circuit that includes the multi-cycle path;

connecting each pair of through points in the multi-cycle to a XOR gate;

connecting each pair of end points in the multi-cycle path to a XOR gate;

connecting the outputs of the XOR gates to an AND gate;

setting the inputs of the through points to zero and one logic values; and setting the pair of starting points in the multi-cycle path to zero and one logic values.

14. The method of claim 13, further comprising reporting on paths that are verified as multi-cycle paths.

15. The method of claim 13, wherein the multi-cycle path is a path where a signal can propagate from an input to an output in at least two clock cycles.

16. The method of claim 15, wherein verifying the satisfiability formula further comprises determining whether the satisfiability formula can be solved in less clock cycles than it requires for a signal to propagate through the multi-cycle path.

17. The method of 13, wherein the Boolean satisfiability solver comprises at least one of: Boolean satisfiability problem (SAT), automatic test pattern generation (ATPG), and binary decision diagram (BDD).

18. A computer aided design (CAD) system embodying a CAD program, said CAD program comprising a computer readable medium with instructions adapted to implement the method of claim 13.

19. A computer program product embodied on a computer readable medium with instructions that when executed on a computer perform the method of claim 13.

* * * * *